United States Patent
Nayfeh et al.

(10) Patent No.: US 10,173,253 B2
(45) Date of Patent: Jan. 8, 2019

(54) METHODS FOR THE DEVELOPMENT OF COMMERCIAL SCALE NANO-ENGINEERED ULTRACONDUCTIVE COPPER WIRE

(71) Applicant: CLEVELAND STATE UNIVERSITY, Cleveland, OH (US)

(72) Inventors: Taysir H. Nayfeh, Cleveland, OH (US); Anita M. Wiederholt, Sheffield Village, OH (US)

(73) Assignee: CLEVELAND STATE UNIVERSITY, Cleveland, OH (US)

(*) Notice: Subject to any disclaimer, the term of this patent is extended or adjusted under 35 U.S.C. 154(b) by 415 days.

(21) Appl. No.: 14/907,072

(22) PCT Filed: Jul. 23, 2014

(86) PCT No.: PCT/US2014/047717
§ 371 (c)(1),
(2) Date: Jan. 22, 2016

(87) PCT Pub. No.: WO2015/013349
PCT Pub. Date: Jan. 29, 2015

(65) Prior Publication Data
US 2016/0151817 A1    Jun. 2, 2016

Related U.S. Application Data

(60) Provisional application No. 61/857,855, filed on Jul. 24, 2013.

(51) Int. Cl.
*H01L 39/24* (2006.01)
*B21C 23/00* (2006.01)
(Continued)

(52) U.S. Cl.
CPC .......... *B21C 23/002* (2013.01); *B21C 23/001* (2013.01); *B21C 37/04* (2013.01);
(Continued)

(58) Field of Classification Search
CPC ..... B21C 23/001; B21C 23/002; B21C 37/04; B21C 37/047; B30B 11/007; B30B 11/26;
(Continued)

(56) References Cited

U.S. PATENT DOCUMENTS 5,494,541 A    2/1996  Fujita et al.
6,112,395 A *  9/2000  Quick ................. B21C 37/047
                                                    29/419.1
(Continued)

FOREIGN PATENT DOCUMENTS

WO    2012/055155 A1    5/2012

OTHER PUBLICATIONS

International Search Report and Written Opinion of International Application No. PCT/US2014/047717, dated Nov. 21, 2014, 10 pages.

*Primary Examiner* — Donghai D Nguyen
(74) *Attorney, Agent, or Firm* — Fay Sharpe LLP

(57) ABSTRACT

When forming ultra-conductive wire, multi-walled carbon nanotubes (MWCNTs) are dispersed and de-agglomerated in hot metal. The MWCNTs are dispersed in a precursor matrix via mixing and sintering to form precursor material, which is hot-extruded multiple rounds at a predetermined temperature to form a nano-composite material. The nano-composite material is inserted into a metal bar to form a nano-composite billet (306), which is subjected to multiple rounds of hot extrusion to form an ultra-conductive material. The ultra-conductive material is subjected to one or more rounds of hot wire drawing to form an ultra-conductive wire comprising a nano-composite filament.

12 Claims, 14 Drawing Sheets

(51) Int. Cl.
*B21C 37/04* (2006.01)
*B22F 3/00* (2006.01)
*B22F 3/16* (2006.01)
*B22F 3/20* (2006.01)
*B22F 7/06* (2006.01)
*B30B 11/26* (2006.01)
*C22C 47/14* (2006.01)
*C22C 49/02* (2006.01)
*C22C 49/04* (2006.01)
*H01B 1/02* (2006.01)
*B30B 11/00* (2006.01)
*B22D 17/04* (2006.01)
*B22D 19/02* (2006.01)

(52) U.S. Cl.
CPC ............ *B21C 37/047* (2013.01); *B22D 17/04* (2013.01); *B22D 19/02* (2013.01); *B22F 3/003* (2013.01); *B22F 3/16* (2013.01); *B22F 3/20* (2013.01); *B22F 7/06* (2013.01); *B30B 11/007* (2013.01); *B30B 11/26* (2013.01); *C22C 47/14* (2013.01); *C22C 49/02* (2013.01); *C22C 49/04* (2013.01); *H01B 1/02* (2013.01); *H01B 1/026* (2013.01); *H01L 39/24* (2013.01); *B22F 2003/206* (2013.01); *B22F 2003/208* (2013.01); *Y10T 29/49014* (2015.01)

(58) Field of Classification Search
CPC ........... H01B 1/026; H01B 1/02; H01L 39/24; C22C 49/02; C22C 49/04; C22C 47/14; B22F 7/06; B22F 3/20; B22F 3/0033; B22F 2003/206; B22F 2003/208; B22F 3/16; B22D 19/02; B22D 17/04; Y10T 29/49014; Y10T 29/49117; Y10T 29/5121
USPC ......................................... 29/599, 828, 33 F
See application file for complete search history.

(56) References Cited

U.S. PATENT DOCUMENTS 7,480,978 B1 *   1/2009   Wong ................... B21C 37/047
                                                      29/599
9,390,839 B2 *   7/2016   Thilly ................... H01B 1/026
2012/0267141 A1  10/2012  Kamiyama et al.

* cited by examiner

METHODS FOR THE DEVELOPMENT OF COMMERCIAL SCALE NANO-ENGINEERED ULTRACONDUCTIVE COPPER WIRE

BACKGROUND

The present application relates to systems and methods for forming ultra-conductive wire. It finds particular application in conjunction with nano-engineered ultra-conductive copper wire, and will be described with particular reference thereto. However, it is to be appreciated that the present exemplary embodiment is also amenable to other like applications.

Since the discovery of electricity, pure metals were thought to have the lowest resistance to transporting electrical current at room temperature. This assumption defined the upper limits of the efficiency and consequently the size and power consumption of all conventional electric machines and devices. Recently, the discovery of carbon nanotubes (CNTs) introduced a new class of metallic carbon nanotube-based conductors (known as ballistic conductors) that are orders of magnitude better at carrying current than pure metals. Unfortunately, conventional approaches to harnessing this potential have not been successful thus far because the nanotubes produced to date are on the order of a few millimeters in length and no one has been able to make practical length segments and/or continuous bundles of wires with these properties. Other attempts at forming nano-composite metal/nanotubes matrices by starting from powdered metals and/or by molecular level mixing failed to produce gains in the electrical conductivity.

Conventional methods are further lacking for several reasons. For instance, it has not been possible to date to effectively disperse nanotubes by traditional mixing methods because of the high Van der Waals forces between the nanotubes. Moreover, the use of traditional surfactants and/or alloying agents to assist in dispersing the nanotubes introduces impurities and reduces the electrical conductivity. Sub-melt processes, such as sintering, create residual porosity and this, along with the previously mentioned items, results in undesirably large contact resistances and the formation of Schottky barriers. Furthermore, non-alloying two-phase materials, such as molten copper and nanotubes, do not mix because of the considerable mismatch between their densities and because copper does not wet carbon. Still furthermore, static processes like sintering are not suitable since they cannot disperse or orient the nanotubes in a manner that increases conductivity.

The systems and methods described herein facilitate forming nano-composite ultra-conductive wire while overcoming the above-mentioned deficiencies and others, as will be appreciated by those of skill in the art.

BRIEF DESCRIPTION

According to one aspect, a bi-directional, dual chamber, hot extrusion flow mill that facilitates forming ultra-conductive wire by de-agglomerating and dispersing multi-walled carbon nanotubes (MWCNTs) in a sub-melt softened-state metal comprises a dual cavity bi-directional die; a first variable speed, variable force hydraulic press that forces a first push block against a nano-composite billet thereby urging the billet through a bi-directional extrusion die that draws down the diameter of the billet by a predetermined amount to form a nano-composite material; and a second variable speed, variable force hydraulic press that forces a second push block against the nano-composite material to urge the nano-composite material through the bi-directional excursion die to further disperse the nano-composite material.

According to another aspect, a method of de-agglomerating and dispersing multi-walled carbon nanotubes (MWCNTs) in hot metal and forming ultra-conductive wire, comprises dispersing the MWCNTs in a precursor matrix via mixing and sintering to form precursor material; hot-extruding the precursor material under vacuum at a predetermined temperature to form a nano-composite material; inserting nano-composite material into a metal bar to form a nano-composite billet; subjecting nano-composite billet to multiple rounds of hot extrusion to form an ultra-conductive material; and subjecting the ultra-conductive material to one or more rounds of hot wire drawing to form an ultra-conductive wire comprising a nano-composite filament.

BRIEF DESCRIPTION OF THE DRAWINGS

The patent or application file contains at least one drawing executed in color. Copies of this patent or patent application publication with color drawing(s) will be provided by the Patent and Trademark Office upon request and payment of the necessary fee.

FIG. 8B illustrates a schematic representation of the ultra-conductive wire forming process using a die cast technique.

DETAILED DESCRIPTION

Figure 1:
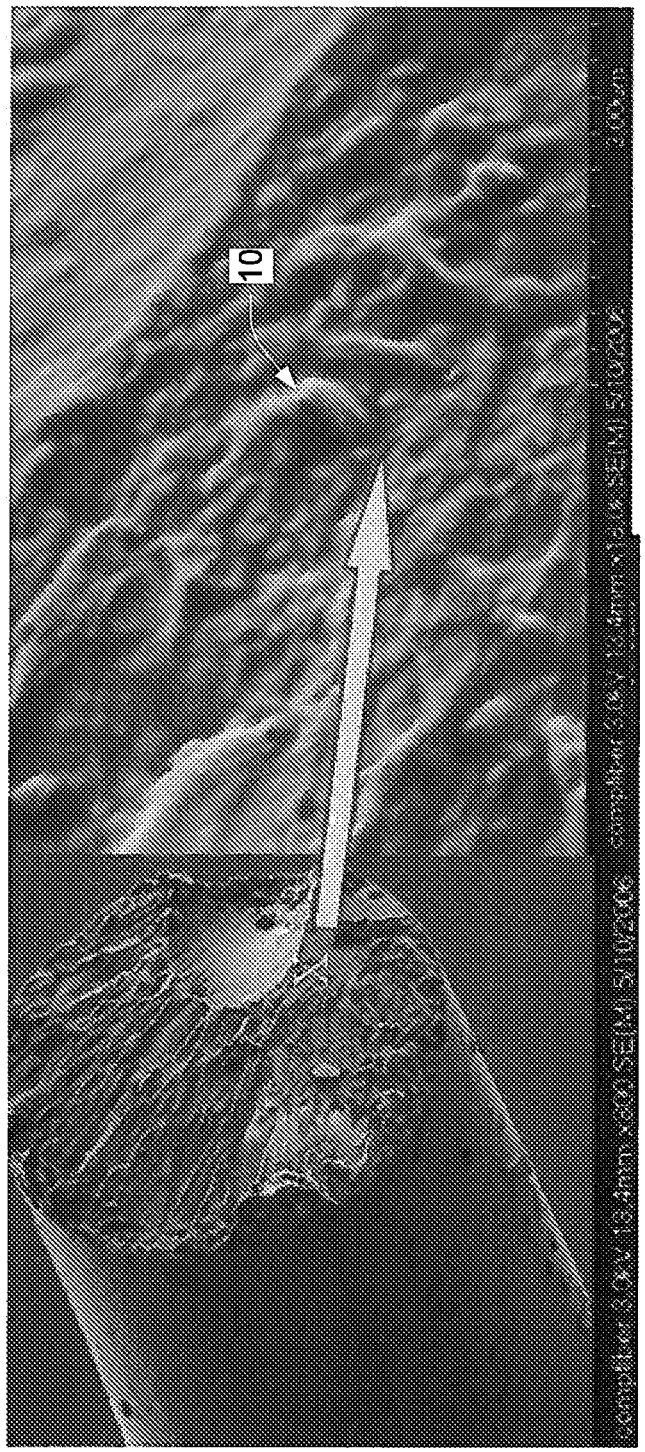
FIG. 1 is an electron microscope image of well dispersed and aligned nanotubes protruding from a fracture in a glass fiber after breaking during a pull test.

FIG. 1 illustrates an example of nano-composite glass fibers 10. The present application discloses a method that utilizes the large dynamic forces encountered in metal die casting processes and the similar conditions encountered in metal hot extrusion and hot wire drawing operations to generate large shear forces to breakup up nanotube agglomerations and ultimately to orient the nanotubes in the direction of the flow. Furthermore, because of the extremely high pressures and high temperatures encountered in these types of process, many of the individual walls of the Multi-Wall Carbon Nanotubes (MWCNTs) become well contacted in the magnesium precursor material. In one example, 100K PSI or more pressure is exerted on the nanotubes/matrix to force molten/soft metal into the nanotubes, thus forming a more intricate electrical conductivity network between the two materials, which results in forming ballistic conductance paths.

Figure 2:
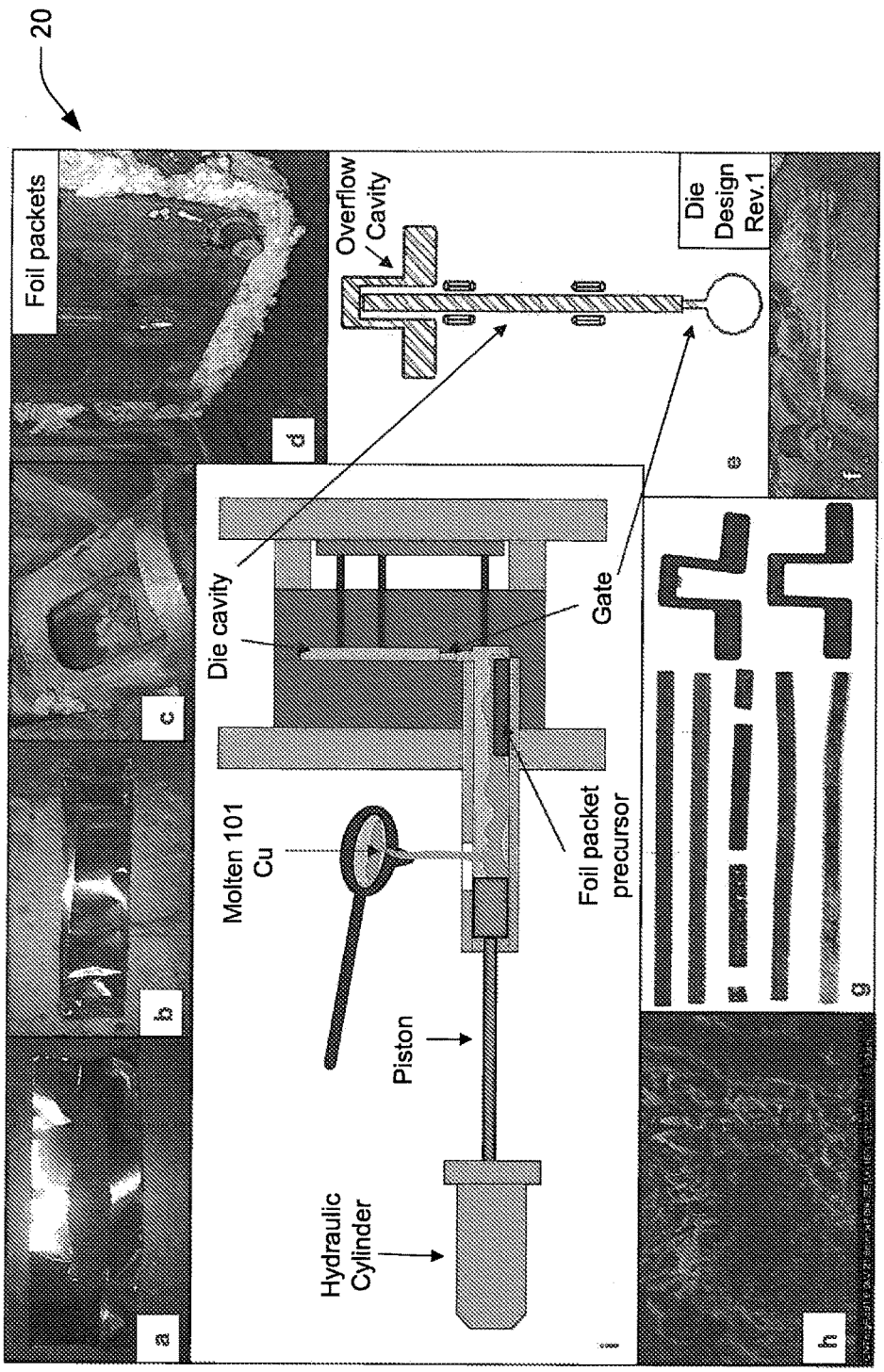
FIG. 2 shows a schematic representation of functionalized MWCNTs (a), wrapped in 101 copper foil (b), placed in the shot sleeve of a die casting machine (c & d), infused into a die cast copper bar (e), (g & h) are X-Ray and electron microscope images of sections of the die cast bar infused with nanotubes.

Several batches of nano-composite copper wire were fabricated using relatively crude forms of the proposed fabrication techniques Nano-composite wire was formed by uncontrolled injection of functionalized Mg/MWCNT into molten copper via high velocity die casting and subsequent wire drawing as shown in FIG. 2.

FIG. 2 illustrates an image 20 comprising a plurality of panels showing various aspects of the die casting process. Panel (a) shows nanotube material on a piece of foil. Panels (b)-(d) show the prepared foil packet with the nanotube material encompassed therein. Panel (e) shows a die design with an overflow cavity, a die cavity, and a gate. Panel (f) shows nanocomposite copper parts in which the nanotubes have been embedded via die casting. Panel (g) shows X-Ray images of the die cast nanocomposite copper parts. Panel (h) is an electron microscopic image of the precursor material showing nanotubes dispersed in the magnesium. Finally, Panel (i) is an illustration of a die press in which a functionalized precursor packet has been inserted into a die chamber into which molten copper is added. A hydraulic cylinder urges a piston head against the copper/precursor nano-composite mixture to force the mixture through a gate into a die cavity where it is permitted to cool.

Figure 3:
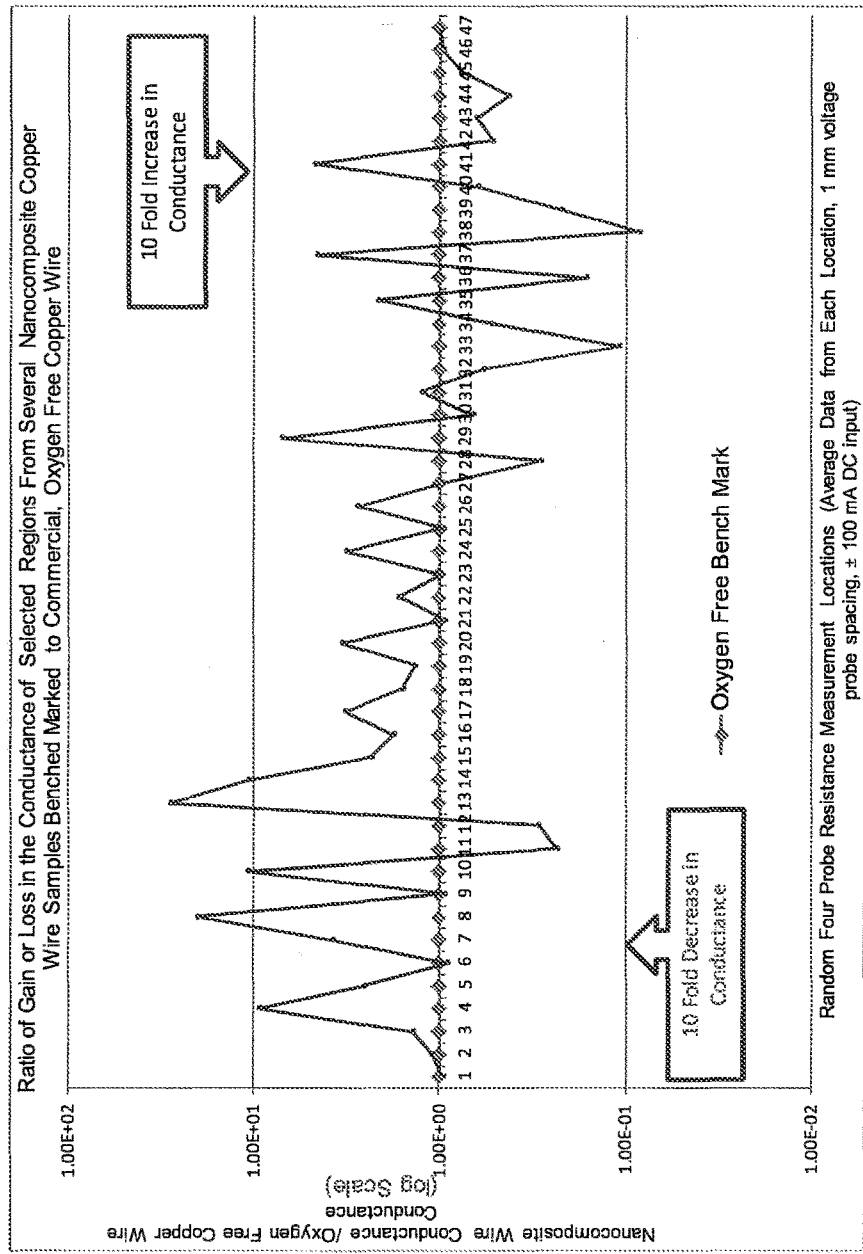
FIG. 3 shows a chart of numerical results from the feasibility study showing gains reaching 23+ folds and also showing large reductions in the conductivity.
Figure 4:
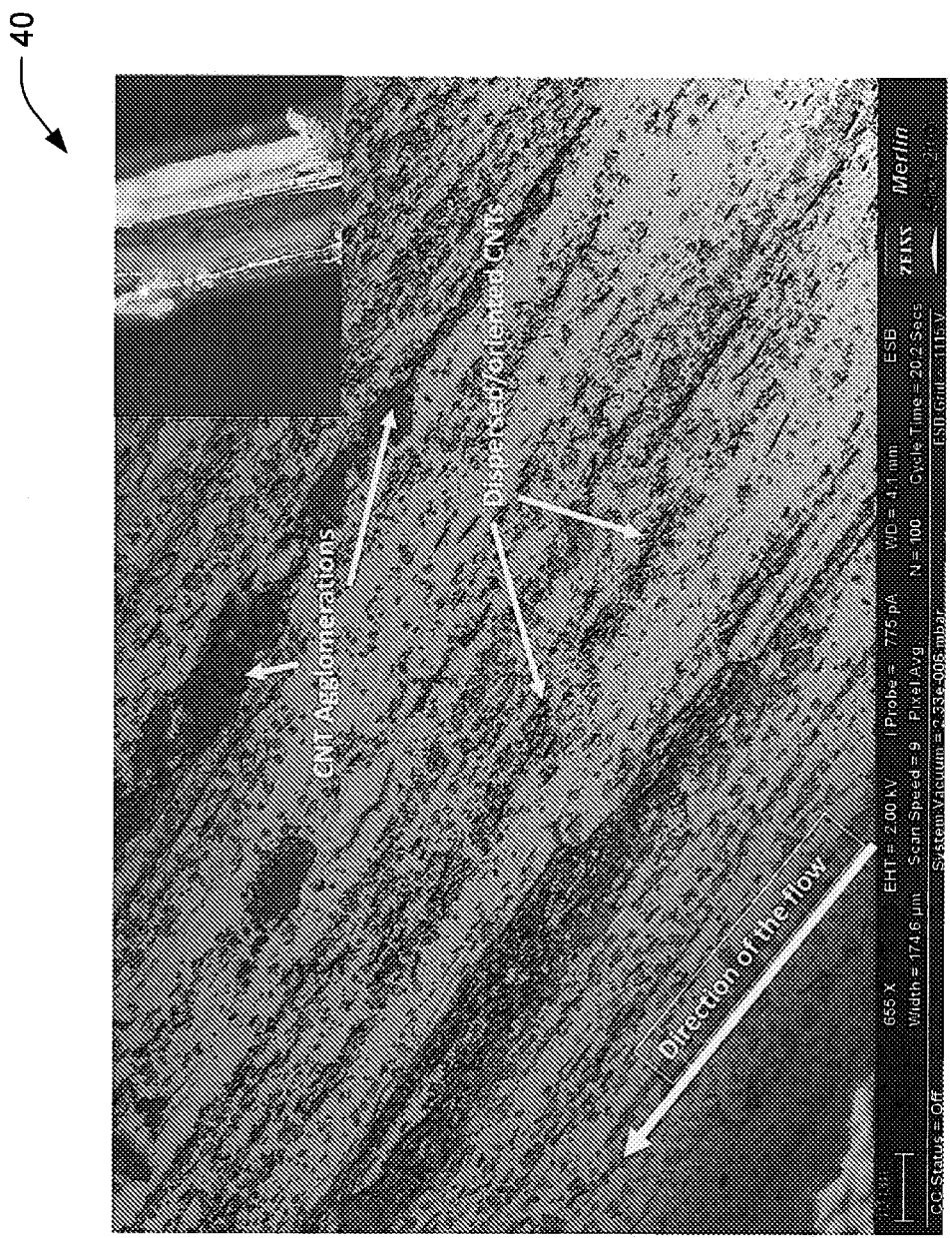
FIG. 4 shows an Electron Microscope (FESEM) image of a nano-composite streak showing areas of well-dispersed and aligned nanotubes and others with large agglomerations.

High-resolution electron microscopy revealed that the nanotubes were well dispersed and aligned in the zones that exhibited gains in the electrical conductivity. In the lower conductivity areas, micrographs indicate that the nanotubes did not disperse and acted as impurities and thus resulted in reduced electrical conductivity. A graph 30 showing random samples of some of the numerical results are shown in FIG. 3 with some of the data corresponding to the areas shown in the electron microscope image 40, as is exhibited in FIG. 4.

When forming continuous and uniform ultra-conductive wire using the described systems and methods, the nanotubes are well dispersed, aligned and intimately connected to the precursor metal and subsequently to the copper matrix. Thus, high pressure processes such as die casting and hot extrusion are employed in order to form the intimate contacts. The concentration and uniformity of the nanotube distribution along the length of the filaments are important in determining the level of the ultra-conductivity. The choice of the type of nanotubes, functionalizing metal and preprocessing techniques are also important to achieving ultra-conductivity. The ultimate current carrying capacity of the wire or cable is a function of the number of filaments and the level of ultra-conductivity of each filament. The ultra-conductive filaments, according to one embodiment, are continuous, narrow diameter (sub-10 micrometer scale), intimately imbedded within the copper/metal matrix jackets.

Additionally, it is apparent that the conduction path between the nanotubes follows primarily a series conduction path along the length of the filaments with no apparent parallel connections between continuous ultra-conductive filaments. Parallel connections between filaments occur only when there is damage to a filament in which case the electrons will flow to a nearby ultra-conductive filament. This behavior is consistent with the behavior of one-dimensional (ballistic) conductors and the theory of the path of least resistance. Therefore, it is desirable to reduce the distance between the filaments as much as possible in order to reduce the Ohmic path when electrons need to jump from one filament to another.

As listed above, the choice of nanotubes plays a role in the development of ultra-conductivity. As such, according to one embodiment, the nanotubes are processed as described in U.S. Pat. No. 8,347,944, which is hereby incorporated by reference herein in its entirety, and then dispersed according to the various methods described herein. The nanotubes are metallic, multiwall, carbon nanotubes (MWCNTs). They are multi-channel ballistic conductors having a stacked cone type architecture. The nanotubes are grown via the chemical vapor deposition process (CVD) and have a mean length as grown of 200-300 μm, an average outer diameter in the range of 90-200 nm. The number of walls ranges from, e.g., 40-50 depending on the individual nanotube. Because of their large diameter and length, these nanotubes may also be called nanofibers. The nanotubes are graphitized by heat-treatment under inert conditions at 3000° C. In order to shorten the nanotubes to an average length of 10-15 μm and also to open them at both ends, the nanotubes are milled down to the desired length. This average length is consistent with predicted range for the average mean free path of electrons over which they are expected to maintain ballistic conductance in nanotubes and also has the potential of breaking the nanotubes at the defect points thus leaving more continuous, better ballistic conducting nanotubes.

The validity of the science for forming ultra-conductive nano-composite copper wire has been demonstrated at a significant scale. More than 23-fold gains in conductivity over conventional pure-metal wire can be achieved depending on the choice of (i) nanotubes, (ii) preprocessing techniques, and (iii) the functionalization process along with the choice of precursor material.

Accordingly, one embodiment described herein relates to a practical method for forming uniform nano-composite precursor material with de-agglomerated, well-dispersed, aligned nanotubes, and with intimate contacts between the multi-walls of the nanotubes and the precursor material. Another embodiment relates to a method to form and insert in copper (or other metals) multitudes of uniform, continuous parallel filaments. In one embodiment the filaments are 10+μm in diameter/width.

Figure 5B:
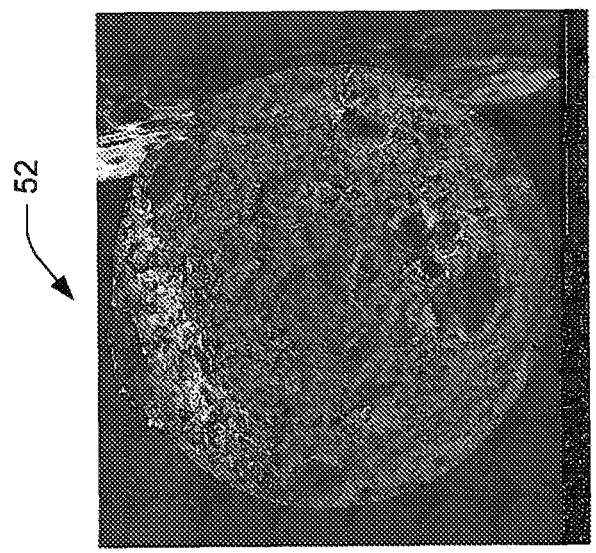
FIG. 5B shows a) cross section of extruded wire (2 mm).
Figure 5A:
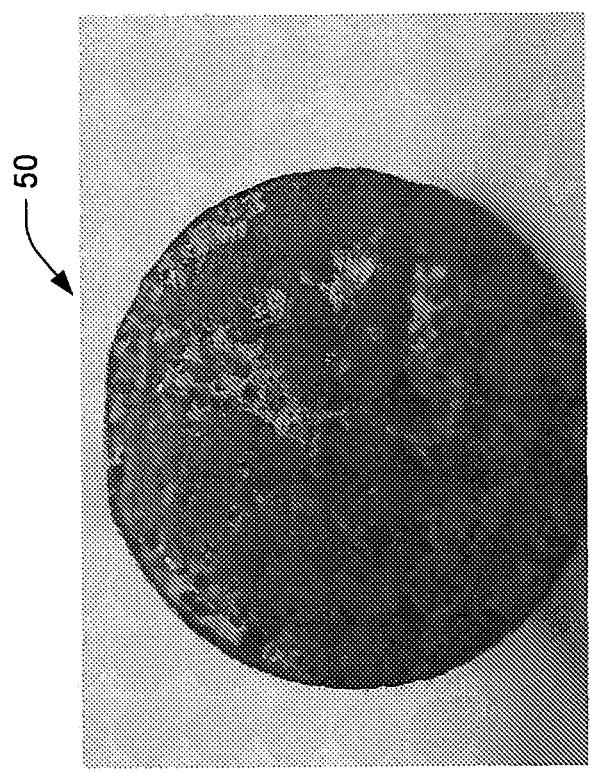
FIG. 5A shows a cross section of sintered nanocomposite billet.
Figure 6B:
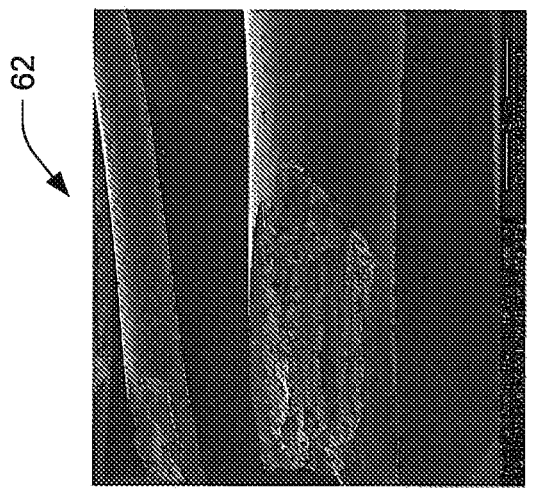
FIG. 6B shows an FESEM image fracture surface.
Figure 6A:
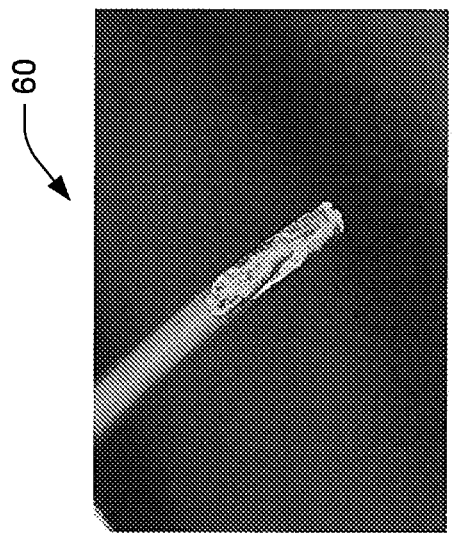
FIG. 6A shows an optical image of fracture surface.
Figure 7B:
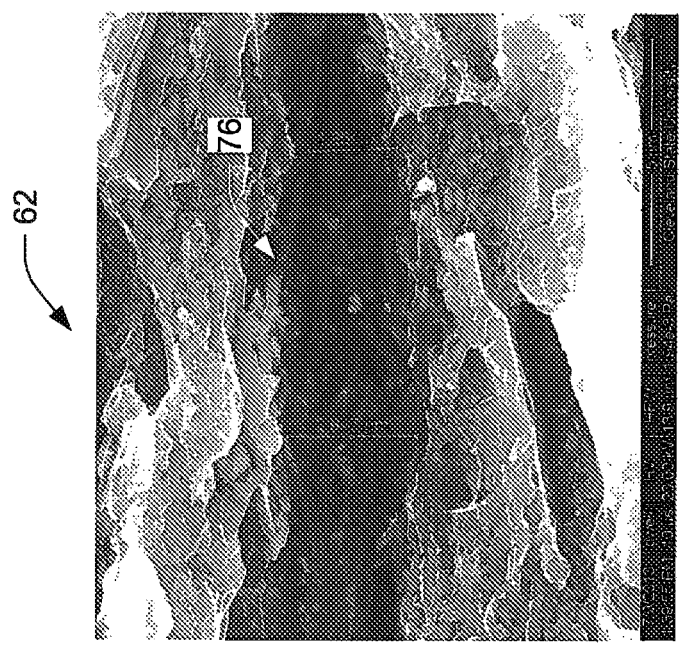
FIG. 7B shows an image of nanotubes in small streak.
Figure 7A:
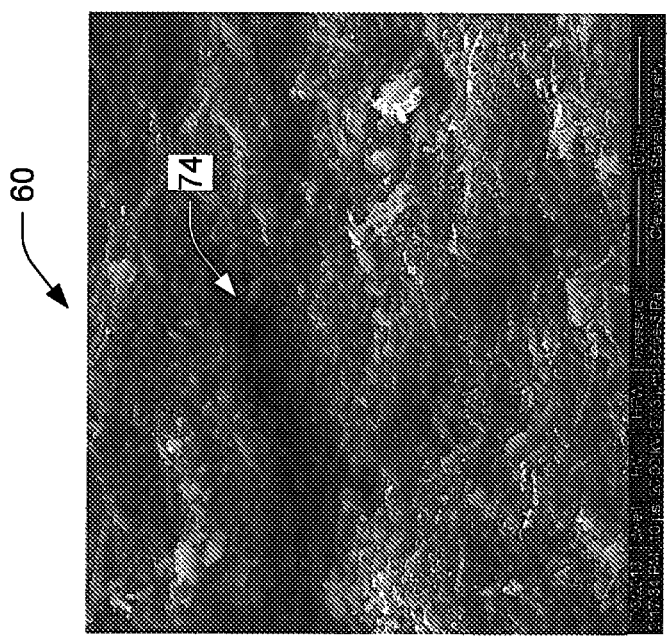
FIG. 7A shows an image of nanotubes in a large streak.

When developing the nano-composite precursor hot extrusion/re-fusing of the nano-composite precursor matrix is iteratively performed to achieve the desired "ultimate" de-agglomeration, dispersion, alignment of the nanotubes in the Mg matrix at sub-melt temperatures. After a single extrusion, it is clear that the agglomerations are greatly reduced in size and stretched out into streaks in the wire. Furthermore, while the nanotubes are still agglomerated and matted in the larger streaks (e.g., 20 µm+) considerable separation, alignment and imbedding of the nanotubes in the smaller streaks (2-3 µm wide) has been observed. After multiple iterations of the extrusion/re-fusion process, all of the streaks become much smaller (sub-micron) and as such will insure that the nanotubes are totally de-agglomerated, imbedded and oriented at the single nanotube level. FIGS. 5A and 5B show cross sections 50, 52, respectively of the billet and the 2 mm extruded wire. FIGS. 6A and 6B are images 60, 62, respectively, of a longitudinal fracture of the extruded 2 mm wire showing both large and small streaks. FIGS. 7A and 7B are electron microscope images 70, 72, respectively, of the nanotubes in a large streak 74 and a small streak 76. In these images, the nanotubes are beginning to separate and align along the longitudinal axis of the extruded wire. The precursor material can be characterized using electron microscopy and other techniques after each extrusion run to determine the level of de-agglomeration along with the distribution and alignment of the nanotubes. After approximately four successive extrusion runs, all the nanotubes streaks are reduced well below the micron level.

With the herein-described extrusion arrangement which reduces the diameter of the billet by a factor of 8, e.g., from 15.875 mm to a 2 mm diameter wire, four iterations of the process result in an equivalent reduction factor of 4096-fold in the diameter of any agglomeration/streak. Thus, starting out with agglomerations that are e.g. 1 mm in diameter (fairly large) in the worst-case scenario, streaks that are reduced to 244 nm in diameter can be achieved. Even though the nanotubes described in the herein-presented examples are fairly large and are of an average diameter of 150 nm, all agglomerations can be resolved to a single nanotube level that will be aligned and well imbedded in the matrix.

The process of refusing the extruded wire into billet form involves sectioning the wire into small millimeter long pellets for the first two re-extrusion passes. The pellets are hot pressed in vacuum back into the billet form for re-extrusion. This process greatly improves the overall distribution of the nanotubes in the matrix and results in a nearly isotropic nano-composite matrix after the projected four rounds of extrusion. For the final two passes, the wires are cut into long sections (length of billet) and horizontally hot pressed to reform the billets while preserving the alignment of the nanotubes.

Another embodiment employs a combination of processes, e.g. hot-extrusion/re-extrusion and hot-wire drawing to form a multitude of precision diameter filaments that are intimately imbedded in the metal matrix to form nano-composite metal/wire and other shapes with the desired ultra-conductivity levels FIGS. 8A-8C and 9.

Figure 8A:
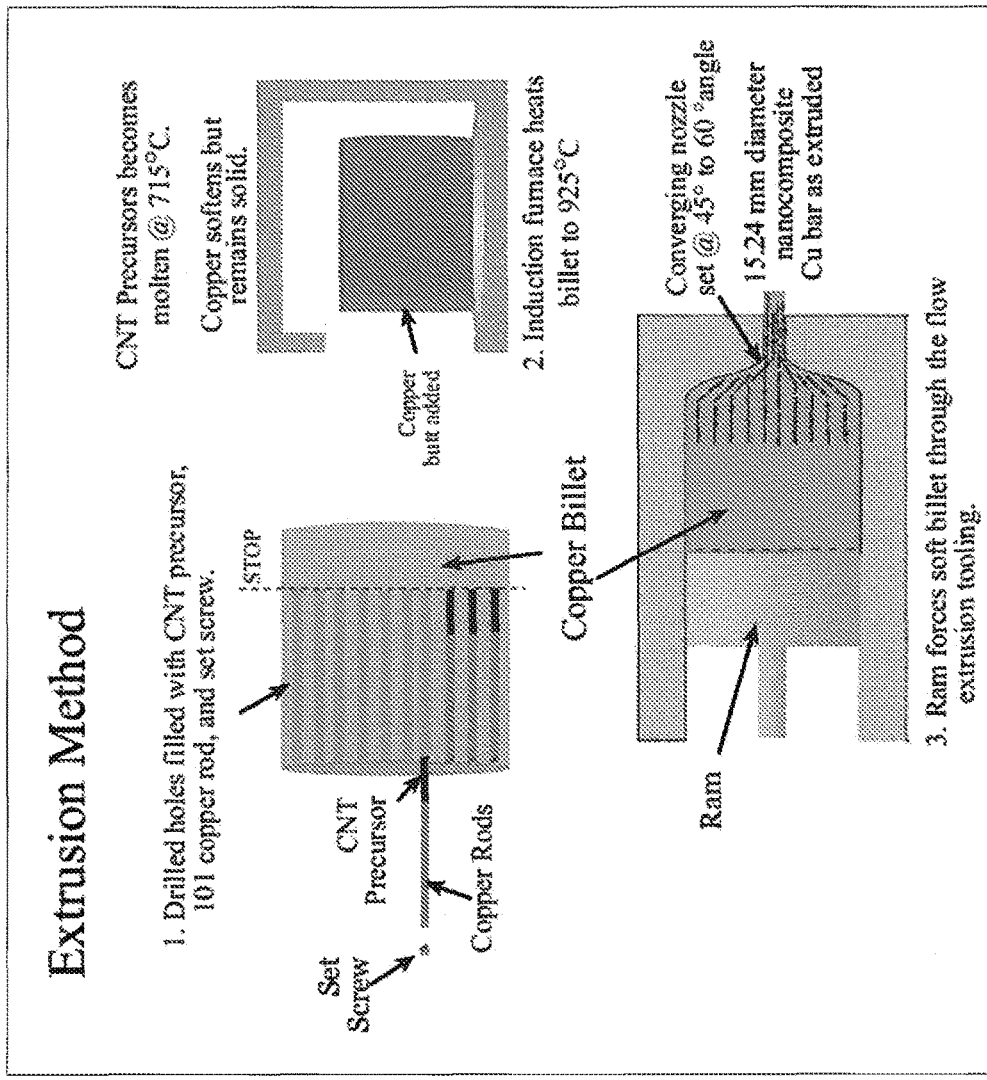
FIG. 8A illustrates a schematic representation of the ultra-conductive wire forming process using an extrusion technique.

FIG. 8A illustrates a schematic representation of the ultra-conductive wire forming process using an extrusion technique. As can be seen, a copper billet comprises drilled holes or channels that are filled with the CNT precursor material, copper rod, and a set screw or plug. An induction furnace heats the billet to, e.g., 860° C. While the CNT precursor becomes molten at approximately 650° C., the copper is softened but remains solid. A ram or piston forces the softened copper billet through the flow extrusion tooling. In one embodiment, the extrusion channel nozzle is has a converging angle of approximately 45° to 60°, although other angles are contemplated. The extrusion process produces a nano-composite copper bar or rod having a predetermined diameter (e.g., 15 mm or the like).

Figure 8B:
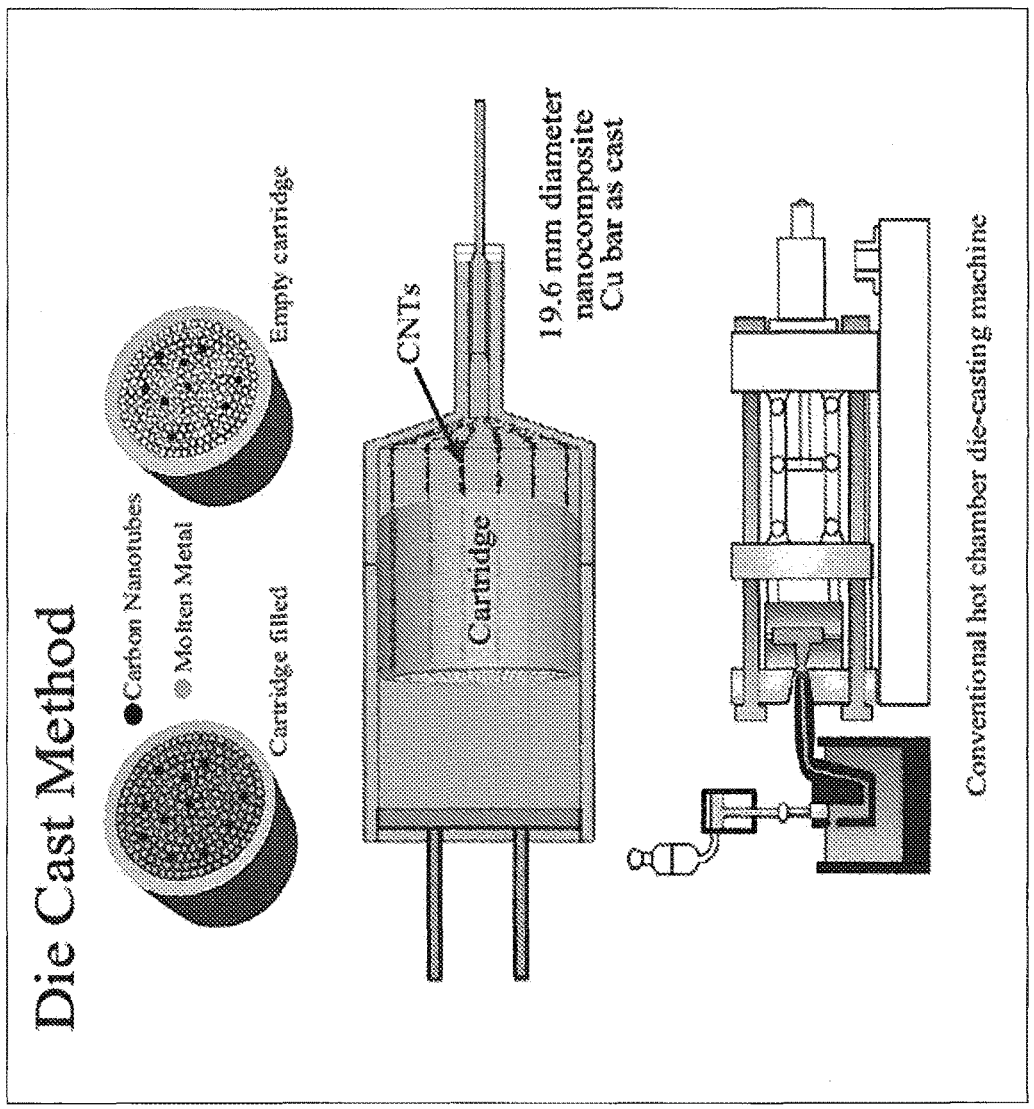
FIG. 8B illustrates a schematic representation of the ultra-conductive wire forming process using a die casting technique.

FIG. 8B illustrates a schematic representation of the ultra-conductive wire forming process using a die cast technique. An empty cartridge having a plurality of channels of a predetermined diameter is shown. CNT precursor material is packed into a subset of the channels. The cartridge is then placed in a chamber of a hot chamber die casting machine. The chamber is filled with molten copper, which is permitted to fill the empty channels of the cartridge. Then copper and CNT material in the channels is then forced outward through an extrusion channel to generate nano-composite bars or rods of a predetermined diameter (e.g., approximately 20 mm or the like).

Figure 8C:
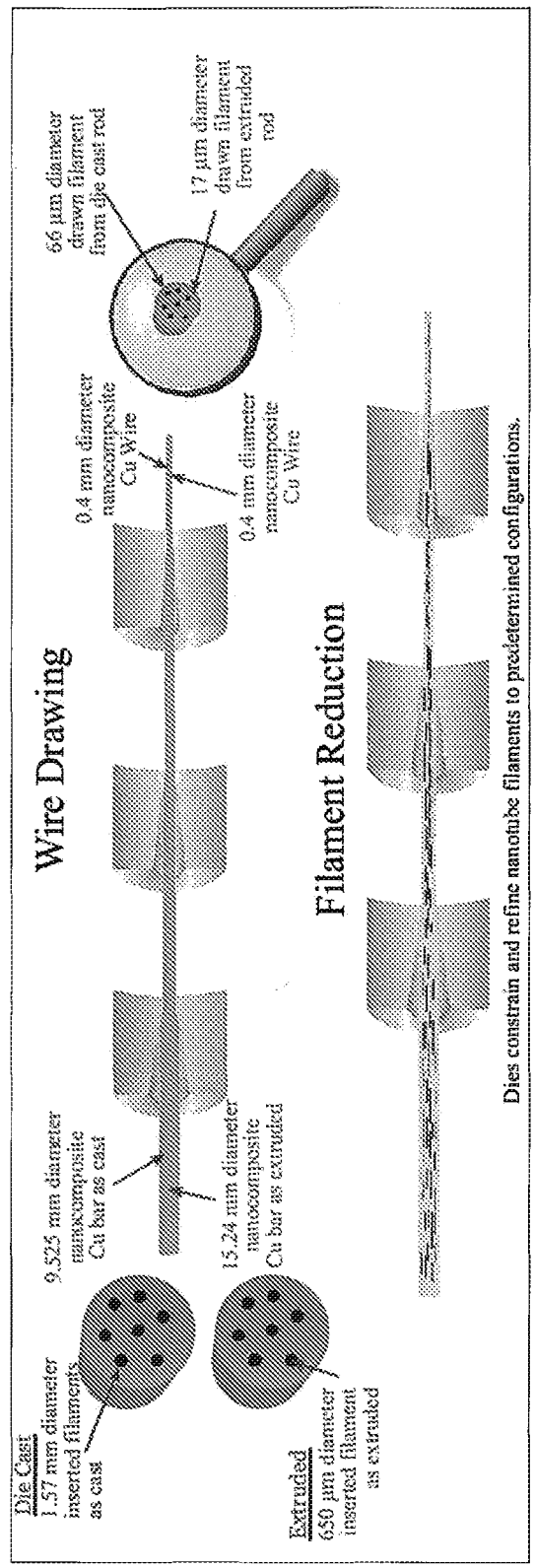
FIG. 8C illustrates a wire drawing and filament reduction process, in accordance with one or more aspects described herein.

FIG. 8C illustrates a wire drawing and filament reduction process, in accordance with one or more aspects described herein. A nano-composite bar or rod as generated using the extrusion or die casting methods of FIG. 8A or 8B is fed into a wire drawing machine to draw down the diameter of the rod to a predetermined diameter (e.g., 0.4 mm or some other predetermined diameter) having nano-filaments on the order of microns or tens of microns in diameter. The wire drawing procedure also refines the orientation and alignment of the filaments to further improve ultra-conductivity.

Figure 9:
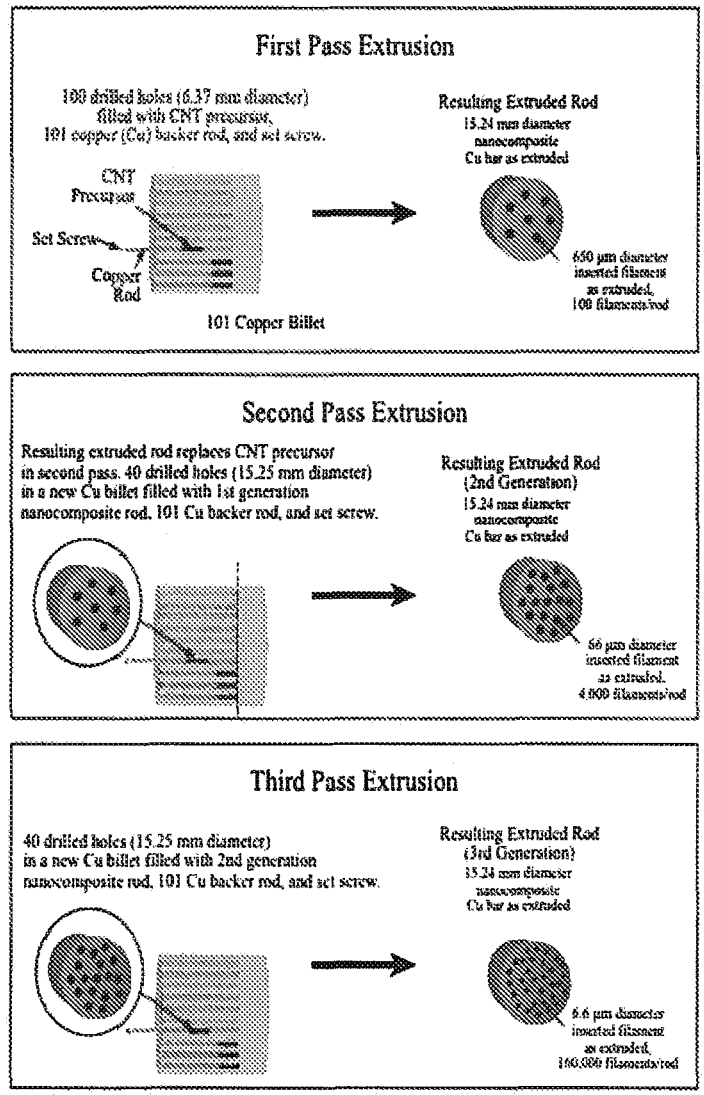
FIG. 9 shows a schematic representation of the filament multiplying procedure or method.

FIG. 9 illustrates a filament re-enrichment procedure in which multiple rounds of extrusion are executed to refine the ultra-conductive wire. In the first pass extrusion, according to an example, in a copper billet 100 holes are drilled having a predetermined diameter (e.g., 6-7 mm) and filled with CNT precursor, a 101 copper backer rod, and a set screw or plug. A resulting extruded nano-composite copper rod has a diameter of, e.g., 15 mm and comprises 100 CNT filaments of e.g., 650 microns or the like.

During a second pass extrusion, in this example, 40 holes are drilled in a copper billet and filled with lengths of the nano-composite rod generated by the first pass extrusion, followed by a copper backer rod and a set screw or plug. The resulting extruded rod is approximately 15 mm in diameter and has 4000 CNT filaments having a diameter of approximately 66 microns.

During the third pass extrusion, 40 holes are drilled in a copper billet and filled with lengths of the nano-composite rod generated by the second pass extrusion, followed by a copper backer rod and a set screw or plug. The resulting extruded rod is approximately 15 mm in diameter and has 160,000 CNT filaments having a diameter of approximately 6.6 microns.

According to another example, the pre-conditioned precursor material developed in Phase I can be extruded into solid rods of the desired diameter and cut to the desired length. The rods are pre-loaded into holes that are drilled in copper/metal billets and sealed. Additionally or alternatively, the rods can be cut to length and bundled together and placed in a copper can, or the appropriate metal and sealed as in the previous example. The billets are then heated to e.g., 500° C., below the melting temperature of the precursor matrix of e.g., 640° C. The billet is then extruded to form a nano-composite rod. Common dimensions include: copper/aluminum billets (6"-8" OD; 9"-24" long). Typical draw down ratio during extrusion of rods is 10:1, i.e.; the rods produced will be 0.6"-1" OD, thus producing net rod lengths of nearly 60'-200' long.

The process can be repeated several times or as needed to produce wire and bus bars with myriad filaments of the desired diameters. For example, starting with a six inch diameter billet with 100 6.3 mm ID holes (precursor rods), after the first pass of 10:1 extrusion, nano-composite rods are formed that are 0.6" in diameter and contain 100 filaments that are 635 µm in diameter. The rods are cut to length and will be directly reinserted into multiple holes (40+) of the same rod diameter into a second copper billet. The second billet is hot extruded to produce a new rod with 4000 filaments at a diameter of 63.5 µm. In this case, and given the parameters selected, each additional pass will create 40-fold more filaments that are one order of magnitude smaller in diameter than the previous extrusion. As such, millions of filaments are formed at micron or submicron diameters, which mitigates any defect that a single filament might contain.

In another embodiment, a hot wire drawing technique is employed to produce fine gauge wire, rather than cold wire drawing. The copper nano-composites are drawn at or near e.g., 350°-500° C. in order to soften the precursor material and thus avoid damage to the nanotubes as they are being pulled in the direction of the draw. The advantage of wire drawing is that the process is capable of dramatically reducing the diameter of the nano-composite rods. For example, a 1" OD rod can be drawn down to various gauge wires, reaching very small gauges (if desired) of 0.1 mm, which corresponds to a draw down ratio of nearly 250:1. The diameter of the imbedded filaments is reduced by the same draw down ratio.

Figure 10:
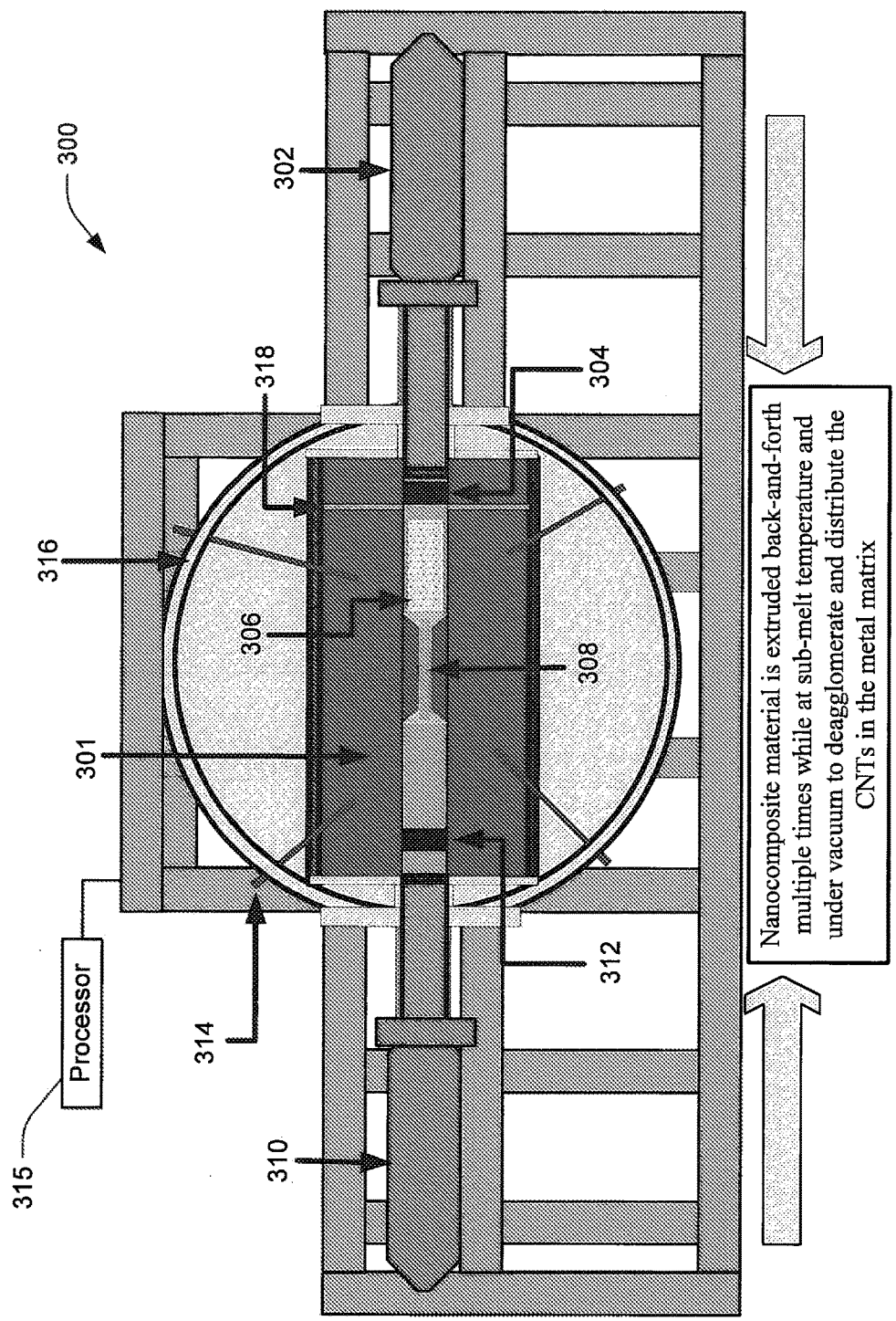
FIG. 10 illustrates a bi-directional, dual chamber, precision hot extrusion machine, also called a hot extrusion flow mill, for de-agglomerating and dispersing CNTs in hot metal, in accordance with various features described herein.

FIG. 10 illustrates a bi-directional, dual chamber, precision hot extrusion machine 300, also called a hot extrusion flow mill, for de-agglomerating and dispersing CNTs in hot metal, in accordance with various features described herein. The flow mill 300 comprises a dual cavity bi-directional die 301, and a first variable speed, variable force hydraulic press 302 that forces a first push block 304 against a nano-composite billet 306 to urge the billet 306 through a bi-directional extrusion die 308 that draws down the diameter of the billet. The flow mill 300 also comprises a second variable speed, variable force hydraulic press 310 that forces a second push block 312 against the billet 306 through the bi-directional extrusion die 308 to refine the dispersion of the nano-composite material in the copper. This process of iteratively extruding the billet material facilitates de-agglomerating and dispersing the CNTs in the metal matrix.

The flow mill 300 further comprises one or more temperature sensors 314 that provide temperature information to facilitate monitoring temperature within the flow mill. Such information can be sent to a computer/processing module 315 that controls hydraulic press speed and/or force as a function of temperature when the metal reaches or exceeds a predetermined temperature (i.e., when the metal is softened and extrudable). The flow mill 300 further comprises a vacuum hot chamber 316 that encompasses the dual cavity bi-directional die 301 and provides a vacuum environment with precision thermal control in order to provide an oxygen-free environment that mitigates the potential for oxidation of the CNTs at temperature. A vacuum vent 318 is provided which draws air out of the vacuum chamber 316 to create a vacuum in the chamber. In this manner, the nano-composite material can be extruded back and forth multiple times while at a sub-melt temperature in a vacuum environment to deagglomerate and distribute the CNTs in the metal matrix.

In one embodiment, the extrusion die 308 is a multichannel die (e.g., having 50-100 channels with an internal diameter of approximately 1 mm, or some other number of channels and/or internal diameter). The soft (e.g., approximately 575° C.) Mg/CNT matrix is pumped back and forth multiple times (e.g., 50-100 times or some other predetermined number of times) until the CNTs are fully deagglomerate and dispersed in the Mg matrix. The flow mill thereby efficiently breaks up and uniformly disperses the nanotubes in the magnesium precursor prior to loading the Mg/CNT matrix into the copper bars for further processing. According to another embodiment, the low mill extrudes the copper/magnesium/CNT billets at a highly controlled temperature of, e.g., 500° C. and highly controlled extrusion speed under vacuum.

The flow mill 300 of FIG. 10 facilitates infusing, dispersing and aligning functionalized (i.e., cut and milled) nanotubes into the precursor matrix (e.g., magnesium) via mixing and sintering followed by multiple rounds of hot extrusion at a temperature of e.g. 525°-550° C. (for copper, although other metals may be used), well below the melting temperature of magnesium of 650° C. Once fully pre-conditioned, the nano-composite matrix is inserted into copper bars (billets) and refined further through multiple rounds of hot extrusion, hot wire drawing, bundling and re-extrusion to form multitudes of nano-composite filaments that are extremely thin (e.g., few microns in diameter) with well dispersed, aligned and intimately contacted nanotubes.

In one embodiment, the flow mill facilitates forming ultra-conductive filaments in nano-composite magnesium. Several millimeter-length filaments are formed after a single round of extrusion with varying ultra-conductivity levels that reach, e.g., at least double the conductivity of copper 101. The flow mill also facilitates de-agglomeration and better distribution of CNTs via hot re-extrusion. Electron Microscope (FESEM) analysis of cross sections of the nano-composite wire reveals that the agglomerations are, on the average: 600 µm after the first round; 200 µm after the second round and roughly 80 µm after the third round of extrusion. In addition, XRD analysis of the cross sections shows progressively improved distribution of the nanotubes as can be seen in FIG. 7. Still furthermore, the flow mill 300 facilitates alignment of the CNTs via fast hot extrusion. Just as in the case of die casting and injection molding, fast laminar flows result in increased alignment of the high aspect ratio CNTs. FESEM images of longitudinal cross sections of different nano-composite wire conclusively show that the rate of extrusion is proportional to the alignment of the nanotubes.

In order to functionalize and insert the nanotubes in the Mg matrix preprocessing methods are used, such as functionalizing (cutting and milling the nanotubes), mixing and sintering the magnesium/nanotubes into billets. Additionally, an oxygen reduction step (vacuum) is executed in order to reduce or eliminate the adsorbed oxygen from the raw material.

A subsequent phase of the method includes de-agglomerating and mixing the nanotubes in magnesium. In one embodiment, this phase of the process is conducted at or near 575° C. and under vacuum. To this end, the two-chamber hot extrusion die system is used to extrude (pump) the heated billets back and forth between the two chambers through a narrow die under high vacuum. De-agglomeration and dispersion of the nanotubes increases as the number of cycles increases. For example, after three rounds of extrusions and re-extrusions, the average agglomeration's size may be reduced from nearly 600 µm to approximately 80 µm. This indicates that each round of extrusion of 8:1 diameter ratio results in reducing the agglomeration's diameter by a factor of 2.5. Therefore, in order to reach an average agglomeration size of approximately 2 µm, 20 rounds of extrusions can be performed. In another example, 100 or more rounds of extrusion/re-extrusion are executed in order to reduce the size of the agglomerations to sub-micron level and to improve the distribution of the nanotubes in the matrix.

Once the nanotubes are well de-agglomerated and dispersed, which can be confirmed via electron microscopy analysis if desired, the nano-composite billet is loaded into an extrusion die that is specifically designed to extrude the Mg/CNT mix directly into a copper bar under high vacuum. In one example, a single filament of the Mg/CNT matrix is formed in oxygen free, 101 copper bars. The concentration of the Mg/CNT relative to copper is initially at 20% by volume.

The Mg/CNT channel in the copper bars is sealed with copper plugs while under vacuum and readied for hot wire drawing. The bars are drawn down at a temperature of, e.g., 300° C. (at which temperature the magnesium is soft enough to stretch) to an outer diameter of 1 mm. This step begins the process of filament thinning and redistributing the nanotubes along the length of the wire.

The Cu/Mg/CNT composite 1 mm outer-diameter wire is cut and bundled together. The wire bundles will be refused together in the vacuum hot chamber at a temperature of, e.g., 600° C. to produce new billets ready for another round of wire drawing. The process will be repeated until the diameter of the imbedded Mg/CNT filaments reaches few micrometers and the number of filaments reaches a critical value to produce ultra-conductivity. In this fashion the nanotubes become completely aligned and their concentration along the length of the filaments can be made into nearly single nanotubes if desired.

According to another example, the process is initiated with a 50 outer diameter, 100 mm-long nano-composite copper bar with a 20 mm internal diameter channel filled with Mg/CNT matrix. The initial 50 mm outer-diameter, 100 mm-long nano-composite copper billet is drawn out to a 1 mm outer diameter, 250 m-long wire. The Mg/CNT filament inside is also stretched out from 20 mm OD, 100 mm-long to a 250 m length at a diameter of 400 µm. Thus, when the 1 mm OD wire is cut to 100 mm lengths and re-bundled together, this process results in bundling together 2500, 1 mm OD wire segments each containing a filament of Mg/CNT 100 mm long and 400 µm OD. In this example, the process is repeated in order to multiply the number of filaments by 2500 in each step of the process, thereby reducing the filaments to the desired diameter.

Since all the processing steps thus far have been performed at a temperature below that of the melting point of magnesium, the electrical contacts between the many walls of the individual MWCMTs and the magnesium intermediary may not have been completely established. The magnesium intermediary is therefore subjected to a full melt in order to establish complete contacts under high pressure. This step is performed after imbedding the Mg/CNT matrix in copper and while re-fusing the Copper/Magnesium/CNT wire towards the end of the process when the diameter of the nano-composite filaments becomes sufficiently small (e.g., near 10 µm) and as such, the nanotubes maintain their position and orientation while confined under the sintering pressure. The temperature is first raised to, e.g., 800°-900° C. for a predetermined period of time (e.g. 1 hour). The temperature is then lowered to below the melting point of magnesium, e.g., 500°-550° C. while maintaining the high pressure (e.g., 5-10 KSI) to continue to confine the nano-composite material and thus to confine the nanotubes.

In order to mitigate oxygen contamination (oxidation) during the many extrusion rounds, and a tendency for the concentration of nanotubes to become sparse in some regions and thus cause the discontinuities between the individual nanotubes to become sufficiently large such that the Ohmic path becomes dominant, the extrusion steps are performed in vacuum to mitigate oxygen contamination. In this manner, the risk of damage to the individual filaments is statistically mitigated given the large number of filaments that are created in the wire.

Figure 11B:
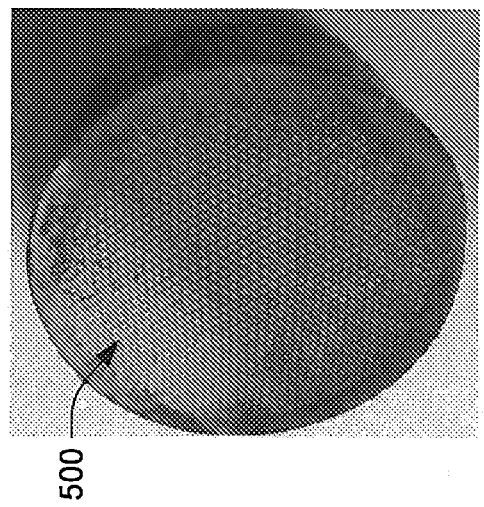
FIG. 11B shows a perspective top-down view of a billet having channels for receiving intermediate nano-composite wire diameters during the bundling, re-bundling and extrusion of the filament multiplying procedure.
Figure 11A:
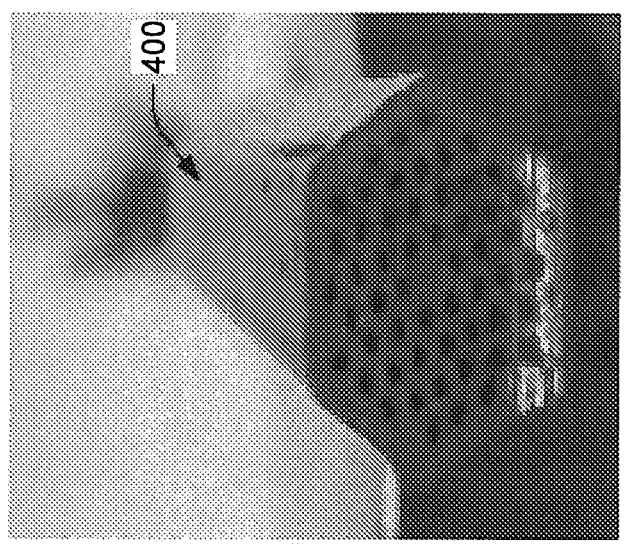
FIG. 11A shows an example of a copper billet into which cut lengths of nano-composite wire are inserted during bundling, re-bundling and extrusion of the filament multiplying procedure.

FIG. 11A shows an example of a copper billet 400 into which cut lengths of nano-composite wire are inserted during bundling, re-bundling and extrusion of the filament multiplying procedure.

FIG. 11B shows a perspective top-down view of a billet 500 having channels for receiving intermediate nano-composite wire diameters during the bundling, re-bundling and extrusion of the filament multiplying procedure.

Figure 12:
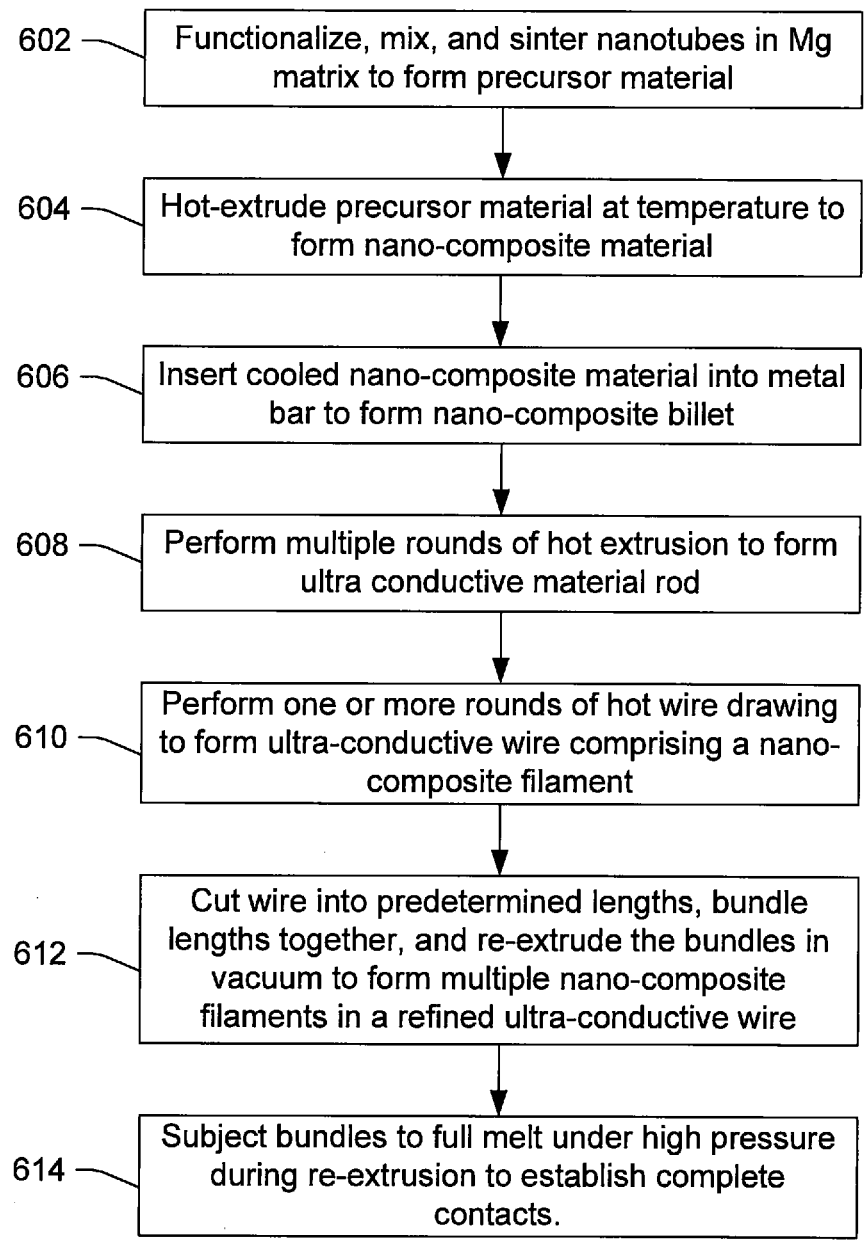
FIG. 12 illustrates a method for forming ultra-conductive wire in accordance with one or more aspects described herein.

FIG. 12 illustrates a method for forming ultra-conductive wire in accordance with one or more aspects described herein. At 602, MWCNTs are dispersed and aligned in a precursor matrix via mixing and sintering to form precursor material. At 604, the precursor material is hot-extruded at a predetermined temperature to form a nano-composite material. At 606, nano-composite material is inserted into a metal bar to form a nano-composite billet. At 608, the nano-composite billet is subjected to multiple rounds of hot extrusion to form an ultra-conductive rod. At 610, the ultra-conductive rod is subjected to one or more rounds of hot wire drawing to form an ultra-conductive wire comprising a nano-composite filament.

At 612, the ultra-conductive wire is cut into predetermined lengths, the lengths of ultra-conductive wire are bundled together, and the bundles are re-extruded to form a plurality of nano-composite filaments in a refined ultra-conductive wire. According to one embodiment, one or more of the extruding, re-extruding, and wire-drawing steps are performed in a vacuum environment. Additionally, at 614 the bundles are subjected to a full melt at a temperature above the melting point of the of the precursor matrix during re-extrusion, thereby establishing complete contacts under high pressure.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A method of de-agglomerating and dispersing multi-walled carbon nanotubes (MWCNTs) in hot metal and forming ultra-conductive wire, comprising:
dispersing and aligning the MWCNTs in a precursor matrix via mixing and sintering to form precursor material;
hot-extruding the precursor material at a predetermined temperature to form a nano-composite material;
inserting nano-composite material into a metal bar to form a nano-composite billet (306);
subjecting the nano-composite billet to multiple rounds of hot extrusion to form an ultra-conductive material; and
subjecting the ultra-conductive material to one or more rounds of hot wire drawing to form an ultra-conductive wire comprising a nano-composite filament.

2. The method according to claim 1, further comprising:
cutting the ultra-conductive wire into predetermined lengths;
bundling the lengths of ultra-conductive wire; and
re-extruding the bundles to form a plurality of nano-composite filaments in a refined ultra-conductive wire.

3. The method according to claim 2, further comprising re-extruding the bundles in a vacuum environment.

4. The method according to claim 2, further comprising subjecting the bundles to a full melt at a temperature above the melting point of the of the precursor matrix prior to final re-extrusion in thereby establishing complete contacts under high pressure.

5. The method according to claim 4, further comprising reducing the temperature at which the re-extrusion is performed to below the melting point of the precursor matrix thereby re-solidifying the precursor matrix during the re-extrusion.

6. The method according to claim 4, wherein the temperature at which the full melt is performed is in the range of approximately 800. degree. C. to 900. degree. C.

7. The method according to claim 1, wherein the metal is copper.

8. The method according to claim 1, wherein the precursor matrix comprises magnesium.

9. The method according to claim 1, further comprising performing the hot extrusion of at least one of the precursor material and the nano-composite billet in a vacuum environment.

10. The method according to claim 1, wherein the predetermined temperature is between approximately 525. degree C. and 550. degree C.

11. The method according to claim 1, wherein the ratio of nano-composite material to metal is approximately 1:5.

12. The method according to claim 1, further comprising sealing the nano-composite material into the metal bar using metal plugs comprising the same metal as the metal bar.

* * * * *